(12) United States Patent
Schloremberg et al.

(10) Patent No.: US 6,358,377 B1
(45) Date of Patent: Mar. 19, 2002

(54) APPARATUS FOR SPUTTER-COATING GLASS AND CORRESPONDING METHOD

(75) Inventors: Marcel Schloremberg, Habay-la-Neuve (BE); Jean-Marc Lemmer, Luxembourg (LU)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 09/731,055

(22) Filed: Dec. 7, 2000

Related U.S. Application Data

(63) Continuation-in-part of application No. 09/685,568, filed on Oct. 11, 2000.

(51) Int. Cl.[7] ............................................. C23C 14/34
(52) U.S. Cl. ........................... 204/192.12; 204/192.13; 204/192.26; 204/298.03; 204/298.25; 204/298.26; 118/719; 414/217; 414/221
(58) Field of Search ..................... 204/192.12, 192.13, 204/192.26, 298.03, 298.25, 298.26; 118/719; 414/217, 221

(56) References Cited

U.S. PATENT DOCUMENTS

| | | | |
|---|---|---|---|
| 4,290,876 A | 9/1981 | Nishiyama et al. | 204/298.13 |
| 4,895,592 A | 1/1990 | Hatwar et al. | 75/10.14 |
| 5,229,194 A | 7/1993 | Lingle et al. | 428/216 |
| 5,298,048 A | 3/1994 | Lingle et al. | 65/60.2 |
| 5,316,631 A * | 5/1994 | Ando et al. | 204/192.2 |
| 5,344,718 A | 9/1994 | Hartig et al. | 428/623 |
| 5,403,458 A | 4/1995 | Hartig et al. | 204/192.15 |
| 5,447,616 A | 9/1995 | Satou et al. | 204/298.13 |
| 5,489,367 A | 2/1996 | Kubota et al. | 204/692.15 |
| 5,507,931 A | 4/1996 | Yang | 204/192.15 |
| 5,558,751 A | 9/1996 | Mahler et al. | 204/298.26 |
| 5,753,089 A | 5/1998 | Haag | 204/192.12 |
| 5,770,321 A | 6/1998 | Hartig et al. | 428/622 |
| 6,228,439 B1 * | 5/2001 | Watanabe et al. | 118/719 |
| 6,241,824 B1 | 6/2001 | Bräuer et al. | 118/730 |

OTHER PUBLICATIONS

U.S. Patent application Ser. No. 09/685,568 filed Oct. 11, 2000.

* cited by examiner

Primary Examiner—Rodney G. McDonald
(74) Attorney, Agent, or Firm—Nixon & Vanderhye P.C.

(57) ABSTRACT

A sputter coating apparatus includes at least a first sputter coating line and a second sputter coating line. The first and second sputter coating lines may be operated in parallel with one another in certain embodiments in order to independently form coating systems and respective coated articles. However, the two coating lines may also be utilized so as to operate in series with one another to form a coated article. In the latter case, a transition zone is provided between an end of the first line and an end of the second line so as to selectively couple an output of the first line to an input of the second line when it is desired to utilize the two sputter coating lines in series with one another. In such a manner, it is possible to avoid many of the inefficiencies associated with conventional sputter coating apparatuses and processes.

6 Claims, 7 Drawing Sheets

APPARATUS FOR SPUTTER-COATING GLASS AND CORRESPONDING METHOD

This is a continuation-in-part (CIP) application of U.S. Ser. No. 09/685,568, filed Oct. 11, 2000, the disclosure of which is hereby incorporated herein by reference.

This invention relates to an apparatus for sputter coating glass, and corresponding method.

BACKGROUND AND SUMMARY OF THE INVENTION

Sputter coated glass articles are known in the art. For example, see U.S. Pat. Nos. 5,770,321, 5,298,048, and 5,403,458, the disclosures of which are all hereby incorporated herein by reference. Sputter coated layer systems on glass substrates are typically utilized for achieving solar management properties (e.g., low emissivity or low-E) in many types of glass articles, including but not limited to architectural windows, automotive windows, automotive windshields, and the like.

Sputter coating may be an electric discharge process, often conducted in a vacuum chamber in the presence of one or more gases. A sputter coating apparatus typically includes at least one vacuum chamber in which a substrate is located, a power source, an anode, and one or more specially prepared cathode targets of or covered with a material to be used in creating a layer on the substrate. When an electric potential is applied to the cathode target, the gas(es) forms a plasma that bombards the target causing particles of the coating material to be liberated or lifted from the target itself. The liberated coating material from the target falls onto the underlying substrate and adheres thereto. When conducted in the presence of a "reactive" gas, a reactive product of the coating material from the target and the gas may be deposited on the substrate.

Unfortunately, conventional sputter coating apparatuses suffer from certain inefficiencies, especially when one desires or needs to manufacture different types of sputter coated articles using the same sputter coating apparatus.

Figure 1:
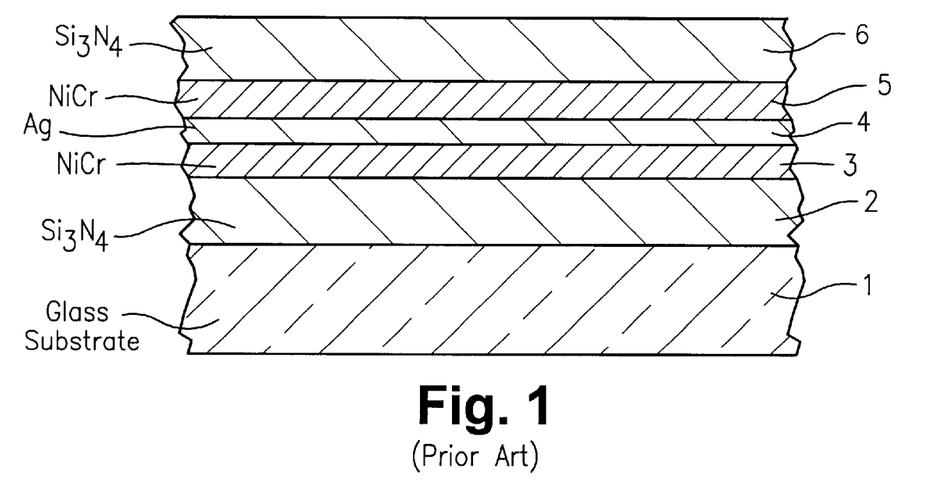
FIG. 1 is sectional view of a conventional sputter coated article.
Figure 2:
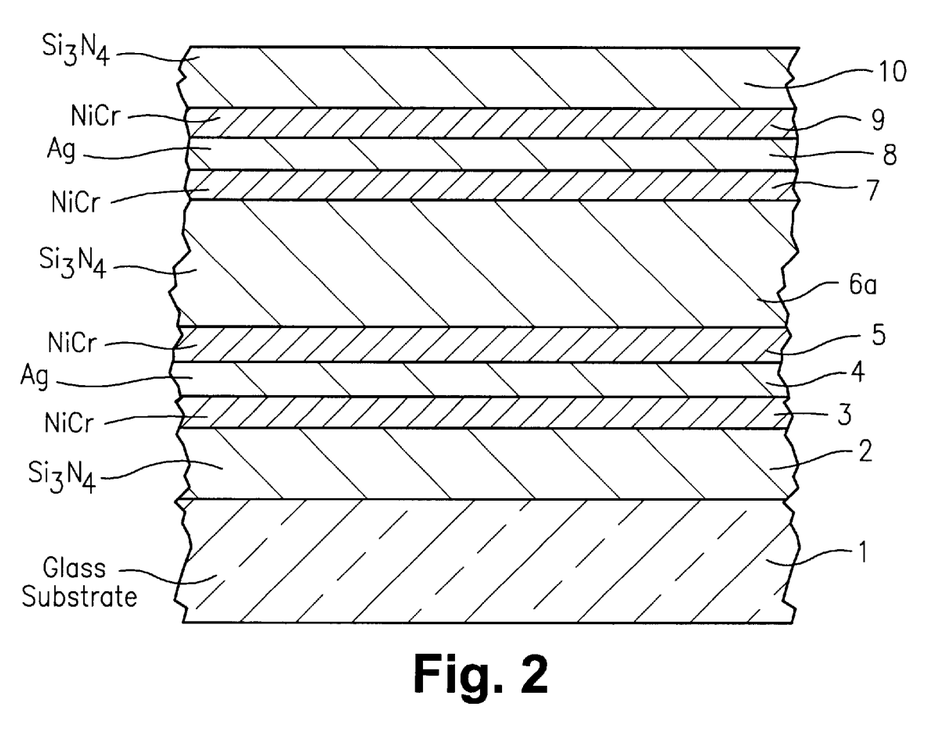
FIG. 2 is a sectional view of another sputter coated article.

Consider, for purposes of examples only, a scenario where one wishes to manufacture the coated articles of FIGS. 1 and 2 utilizing a sputter coating apparatus. The coated article of FIG. 1 includes glass substrate 1 on which are located silicon nitride ($Si_3N_4$) layer 2, nichrome or nichrox (NiCr or $NiCrO_x$) layer 3, silver (Ag) layer 4, nichrome or nichrox (NiCr or $NiCrO_x$) layer 5, and silicon nitride ($Si_3N_4$) layer 6. Optionally, another layer (e.g., a dielectric layer) may also be provided between substrate 1 and layer 2. Further details regarding the coated article of FIG. 1 may be found in U.S. Pat. No. 5,770,321, incorporated herein by reference. Meanwhile, the coated article of FIG. 2 also includes layers 2–6 provided on glass substrate 1. However, the coated article of FIG. 2 further includes a thicker silicon nitride ($Si_3N_4$) layer 6a (instead of layer 6 shown in FIG. 1), nichrome or nichrox (NiCr or $NiCrO_x$) layer 7, second silver (Ag) layer 8, nichrome or nichrox (NiCr or $NiCrO_x$) layer 9, and silicon nitride ($Si_3N_4$) layer 10. The coating system of FIG. 2 may be referred to as a dual silver coating system because it includes first and second silver (Ag) layers 4 and 8 provided for infrared (IR) radiation reflection, respectively, as opposed to the single silver layer 4 provided in the coated article of FIG. 1.

Figure 3:
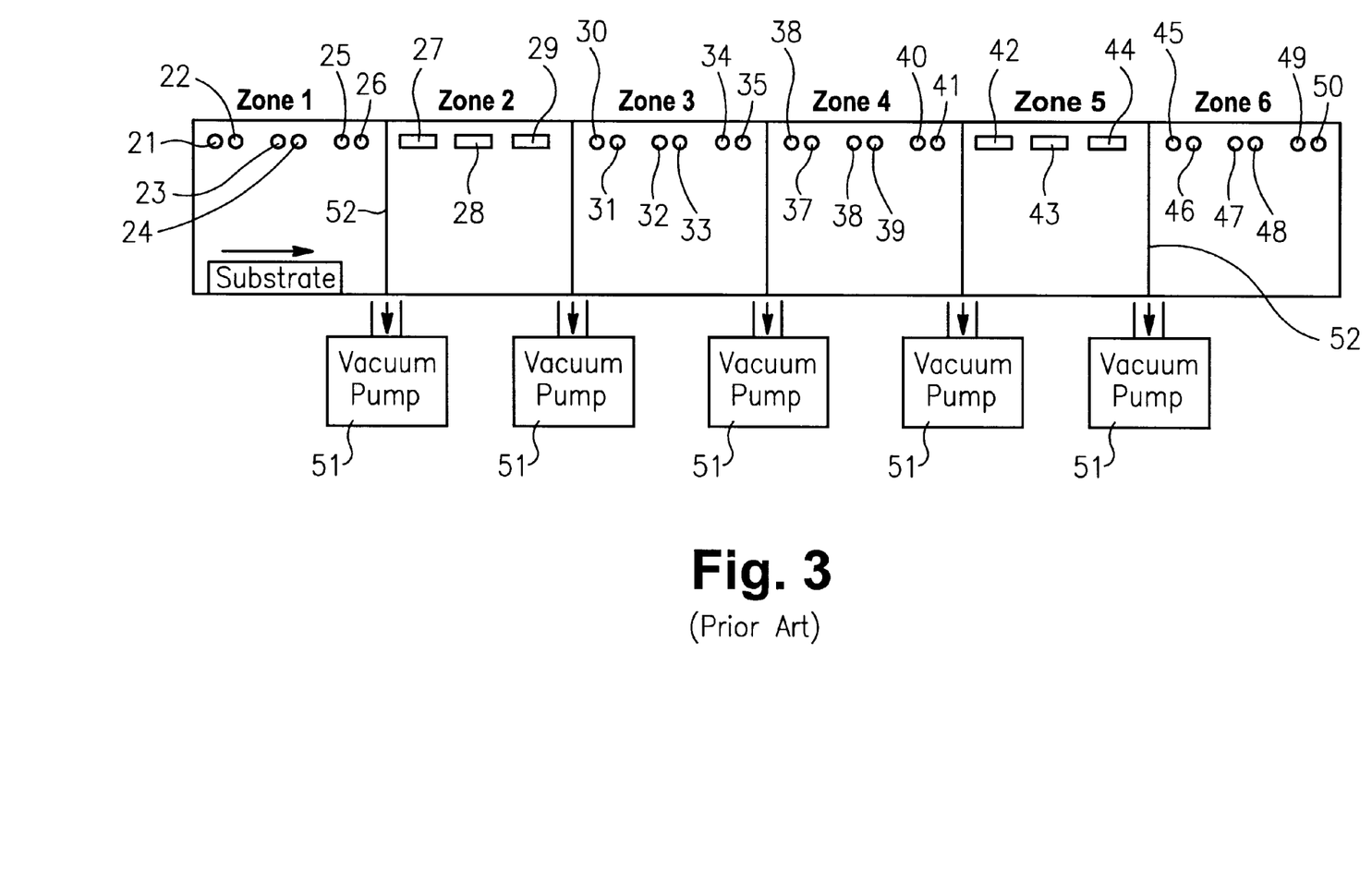
FIG. 3 is a schematic diagram of a conventional sputter coating apparatus.

To manufacture both the coated article of FIG. 1 and the coated article of FIG. 2 using the same sputter coating apparatus, one would typically obtain a sputter coating apparatus as shown in FIG. 3. The FIG. 3 sputter coating apparatus includes enough targets and zones to enable each of layers 2–10 to be deposited on a substrate 1 (i.e., it is large enough and has enough capacity to enable either the FIG. 1 or the FIG. 2 article to be made therein). In particular, the sputter coating apparatus includes six different zones (i.e., zones 1–6) which are separated from one another by curtains or walls 52. Zone 1 includes targets 21–26. Zone 2 includes targets 27–29. Zone 3 includes targets 30–35. Zone 4 includes targets 36–41. Zone 5 includes targets 42–44. Zone 6 includes targets 46–50. A different gas (e.g., argon, nitrogen, oxygen, etc.) may be utilized in each zone at low pressure, while vacuum pumps 51 are provided between zones in order to keep gaseous atmospheres from one zone from significantly leaking into an contaminating adjacent zone(s).

In order to manufacture the coated article of FIG. 1 using the sputter coating apparatus of FIG. 3, a typical line speed of the sputter coater is 205 inches per minute for this five layer system. For the FIG. 1 coating system to be deposited, targets 21–26 in zone 1 are silicon (Si) targets, while nitrogen gas at low pressure is provided in that zone. Following deposition of silicon nitride layer 2 in zone 1 using targets 21–26, the substrate 1 passes into zone 2 via a conveyor. In zone 2, targets 27 and 29 are of nickel and/or chrome, while target 28 is of silver. An argon (Ar) atmosphere may be utilized in zone 2. After the nichrome layers 3 and 5 and silver layer 4 are deposited in zone 2, a conveyor moves the substrate into zone 3 beneath targets 30–35. In zone 3, targets 30–35 are of silicon (Si) while a nitrogen ($N_2$) gas at low pressure is utilized in that zone. Each of zones 1–3 may be maintained at a pressure of from about 1.0 to $3.0 \times 10^{-3}$ Torr, or any other pressure disclosed in any of the aforesaid '321, '048 and '458 patents. Upon leaving zone 3, the coating system of FIG. 1 will have been formed. Thus, zones 4–6 and their respective targets 36–50 are inoperative in the FIG. 3 apparatus when the coated article of FIG. 1 is deposited as discussed above. Unfortunately, the inoperation of these three zones 4–6 is wasteful, and also presents a requirement for passing a coated article through inoperative zones thereby leading to potential contamination and/or undesirable delay.

However, when it is desired to manufacture the coated article of FIG. 2 utilizing the apparatus of FIG. 3, zones 1–3 are set up and utilized as described above regarding the FIG. 1 article. In addition, zones 4–6 are set up just like zones 1–3, respectively. Thus, the upper half of silicon nitride layer 6a and layers 7–10 are deposited in zones 4–6. In other words, targets 36–41 are silicon targets in a nitrogen atmosphere of zone 4, targets 42 and 44 are nickel and/or chrome targets in an argon atmosphere in zone 5, target 43 is a silver target in the same argon atmosphere of zone 5, and targets 45–50 are silicon targets in a nitrogen atmosphere of zone 6. Thus, all six zones (i.e., zones 1–6) are utilized when forming the layer system of the FIG. 2 coated article.

Unfortunately, as can be seen from the above, it is often desired to manufacture coated articles of different types such as those of FIGS. 1 and 2. If this is to be done utilizing the same sputter coating apparatus, such an apparatus must be obtained which has enough zones and targets to enable the coating system having the largest number of layers to be manufactured. Thus, one desiring to manufacture the articles of both FIG. 1 and FIG. 2 would have to purchase a sputter coating apparatus such as that shown in FIG. 3 having sufficient zones and targets to accommodate the FIG. 2 article. Unfortunately, many of these zones and targets are wasted and not utilized when only the article of FIG. 1 is manufactured (i.e., certain zones and/or targets would likely be inoperative during manufacture of the FIG. 1 article). In other words, a significant portion of the coating apparatus may not be used when certain coated articles having a small number of layer(s) are being manufactured. Yet another problem is that when it is desired to upgrade a particular sputter coating apparatus, the line (i.e., all zones 1–6) must be shut down.

In view of the above, it will be appreciated by those skilled in the art that there exist a need for a sputter coating apparatus which can more efficiently manufacture sputter coated articles of different types without wasting significant resources (e.g., zones and/or targets). There also exists a need in the art for a corresponding method.

It is a purpose of different embodiments of this invention to fulfill any and/or all of the above described needs in the art, and/or other needs which will become apparent to the skilled artisan once given the following disclosure.

An object of this invention is to provide a sputter coating apparatus capable of more efficiently depositing different types of sputter coated layer systems.

Another object of this invention is to provide a sputter coating apparatus including first and second sputter coating lines that are selectively coupleable to one another via a transition zone. Each of the first and second sputter coating lines may be independently utilized to deposit particular coating systems on a substrate. However, when it is desired to deposit a coating system having more than a predetermined number of layers (e.g., a layer system having more layers than either of the lines is capable for depositing), the transition zone couples the two lines together thereby enabling an incompleted sputter coated article leaving the first sputter coating line to be routed to the second sputter coating line so that additional layer(s) may be sputter coated thereon. Thus, the two sputter coating lines may be used either independently (e.g., run in parallel to one another), or alternatively may be used in conjunction with one another (e.g., run in series with one another).

Yet another object of this invention is to fulfill any and/or all of the aforesaid objects and/or needs.

Generally speaking, certain embodiments of this invention fulfill one or more of the above-listed needs and/or objects by providing a sputter coating apparatus comprising:

a first sputter coating line including a plurality of zones and a plurality of targets;

a second sputter coating line including a plurality of zones and a plurality of targets; and a transition zone coupled to the first sputter coating line and the second sputter coating line, said transition zone selectively coupling the first and second sputter coating lines to one another so that when not coupled to one another the first and second lines can run in parallel with one another and when coupled to one another by the transition zone the first and second lines run in series with one another.

Certain other embodiments of this invention fulfill one or more of the above-listed needs and/or objects by providing a method of sputter coating a glass substrate, the method comprising the steps of:

providing the glass substrate;

causing the glass substrate to pass through a first sputter coating line including a plurality of zones and a plurality of targets so that at least first and second layers are sputtered onto the first substrate in the first sputter coating line;

determining whether it is desired to provide additional layers on the glass substrate, and if so then upon the glass substrate exiting the first sputter coating line causing the glass substrate to be forwarded to a second sputter coating line including a plurality of zones and a plurality of targets; and causing the glass substrate to pass through the second sputter coating line so that at least third and fourth layers are sputtered onto the first substrate over the first and second layers in the second sputter coating line.

DETAILED DESCRIPTIONS OF CERTAIN EMBODIMENTS OF THIS INVENTION

Referring now more particularly to the accompanying drawings in which like reference numerals indicate like parts throughout the several views.

Figure 4:
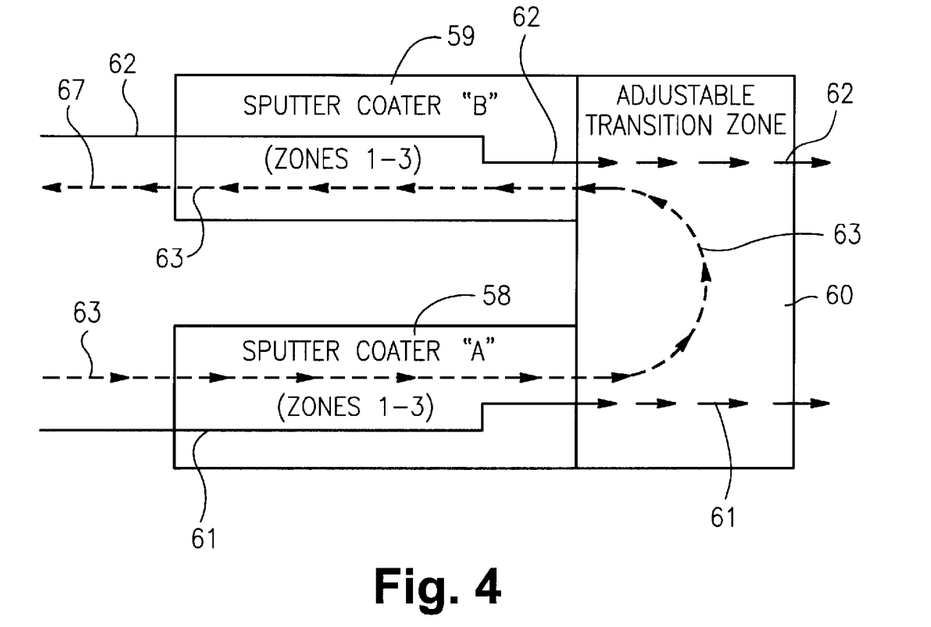
FIG. 4 is a schematic functional diagram of a sputter coating apparatus according to an embodiment of this invention, the sputter coating apparatus including two sputter coating lines capable of running in parallel with one another or alternatively in series with one another.
Figure 5:
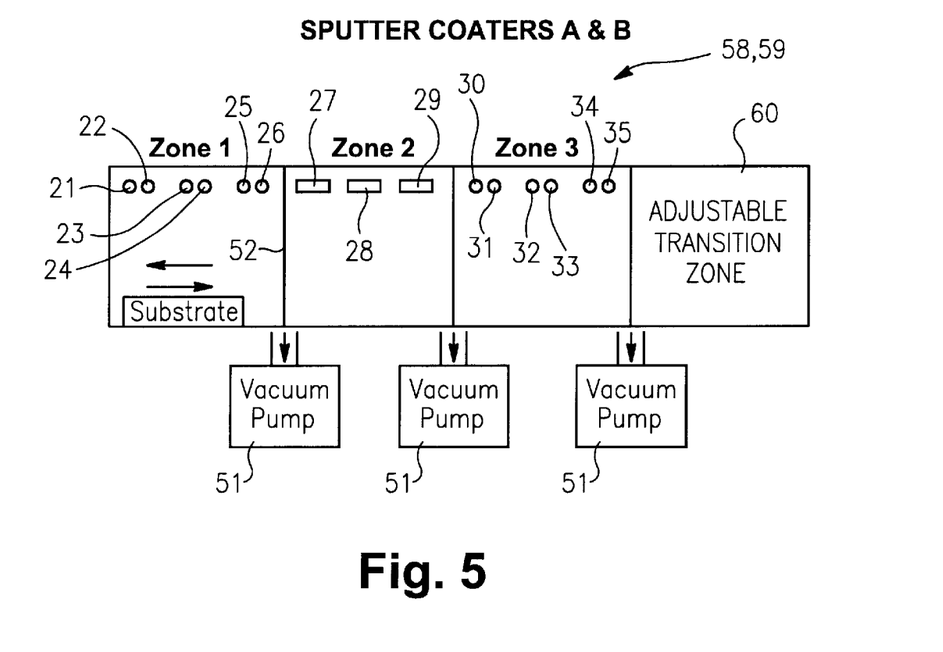
FIG. 5 is a schematic functional diagram of either the sputter coating line "A" and/or the sputter coating line "B" of FIG. 4.

FIG. 4 is a schematic functional diagram of a sputter coating apparatus according to an embodiment of this invention. The sputter coating apparatus of FIG. 4 includes a first sputter coating line 58, a second sputter coater line 59, and adjustable transition zone 60 coupling respective ends of the two sputter coating lines. FIG. 5 is a schematic functional diagram of both the first sputter coater line 58 and the second sputter coater line 59 of FIG. 4. As can be seen, each of the lines 58 and 59 have three zones (zones 1–3) in this exemplary embodiment and include targets 21–35. Transition zone 60 is provided at the end of each sputter coating line 58, 59 so as to enable the lines to be selectively coupled to one another when desired. In other words, the two sputter coating lines 58, 59 may be used independently from one another so as to operate in parallel to one another when each line is depositing an entire coating system on a substrate independent of the other line. Alternatively, when it is desired to form a larger coating system having more layers than one of lines 58, 59 is capable of depositing on a substrate, then transition zone is capable of coupling lines 58 and 59 to one another so that the lines operate in series with one another in forming the larger coating system on the substrate.

Referring to FIGS. 4–5, exemplary uses of this embodiment are described as follows. Consider a situation where one desires to manufacture significant quantities of sputter coated articles as shown in FIG. 1. In such a case, each of sputter coating lines 58 and 59 is set up so that targets 21–26 are silicon (Si) targets in a nitrogen atmosphere of zone 1, targets 27 and 29 are nickel and/or nickel-chrome targets in an argon (Ar) atmosphere of zone 2, target 28 is a silver (Ag) target in the argon atmosphere of zone 2, and targets 30–35 are silicon (Si) targets in a nitrogen atmosphere of zone 3. Thus, in each coating line 58, 59, zones 1 and 3 deposit the respective silicon nitrides layer 2 and 6, while layers 3–5 are deposited in zone 2. In other words, coating line 58 functions to form the layer system of the FIG. 1 coated article, as does coating line 59. The two lines may work on parallel with one another in an independent manner. When operating in parallel with one another, lines 61 and 62 in FIG. 4 illustrate respective paths of substrates being coated as they pass through the respective sputter coating lines and transition zone 60, so that FIG. 1 coated articles formed in each of lines 58 and 59 exit transition zone 60 as illustrated.

Accordingly, it can be seen that the sputter coating apparatus of FIGS. 4–5 enables coated articles as shown in FIG. 1 to be manufactured without the requirement for a significant number of inoperative zones and/or chambers. In other words, significant or substantial portions of both sputter coating line 58 and sputter coating line 59 are in operation at all times during the manufacture of FIG. 1 coated articles. Significant resources are not being wasted. Alternatively, in other embodiments of this invention it is possible to run sputter coating lines 58 and 59 in parallel with one another while line 58 is forming a first type of layer system (e.g., $Si_3N_4$/NiCr/Ag/NiCr/$Si_3N_4$) and line 59 is forming a second type of layer system (e.g., SnO/Ag/SnO) on respective substrates 1.

However, consider the scenario where one desires to utilize the FIGS. 4–5 sputter coating apparatus to manufacture coated articles as shown in FIG. 2 (e.g., a dual silver layer system). In such a case, the first sputter coating line 58 is set up to deposit layers 2–5 and a lower portion of layer 6a on substrate 1. Upon leaving the first sputter coating line 58, the incomplete coated article enters transition zone 60 which directs the incomplete coated article to an end of the second sputter coating line 59 as shown by dotted line 63 in FIG. 4. Reversible sputter coating line 59 is set up so as to deposit the remainder of layers 6a as well as layers 7–10 on substrate 1. The resulting FIG. 2 coated article exits the second coating line 59 at the other end 67 thereof as shown in FIG. 4. Thus, the two coating lines 58 and 59 work in series with one another as a first portion of the coating system is deposited by sputter coating line 58 and a second subsequent portion of the coating system is deposited by sputter coating line 59. Adjustable transition zone 60 selectively couples the output end of first coating line 58 to an input/output end of coating line 59. Thus, layer 2 is deposited in zone 1 of line 58, layers 3–5 in zone 2 of line 58, the first half of layer 6a in zone 3 of line 58, the second half of layer 6a in zone 3 of line 59, layers 7–9 in zone 2 of line 59, and layer 10 in zone 1 of sputter coating line 59 (e.g., zones 1–3 of line 58 may be set up in the same manner as zone 1–3 of line 59 so that the incomplete coated article exiting line 58 may enter the second sputter coating line 59 from either end thereof as a function of convenience).

As can be seen by the different substrate paths illustrated by reference numerals 62 and 63 in FIG. 4, sputter coating line 59 is reversible in that substrates may pass therethrough in either direction depending upon the functionality of transition zone 60 (i.e., whether transition zone 60 is causing coated articles exiting lines 58, 59 to pass straight through as shown by reference numerals 61 and 62 to exit the overall coating apparatus, or whether transition zone 60 is directing incomplete coated articles exiting coating line 58 to an input of coating line 59 as shown by reference numeral 63).

Figure 6:
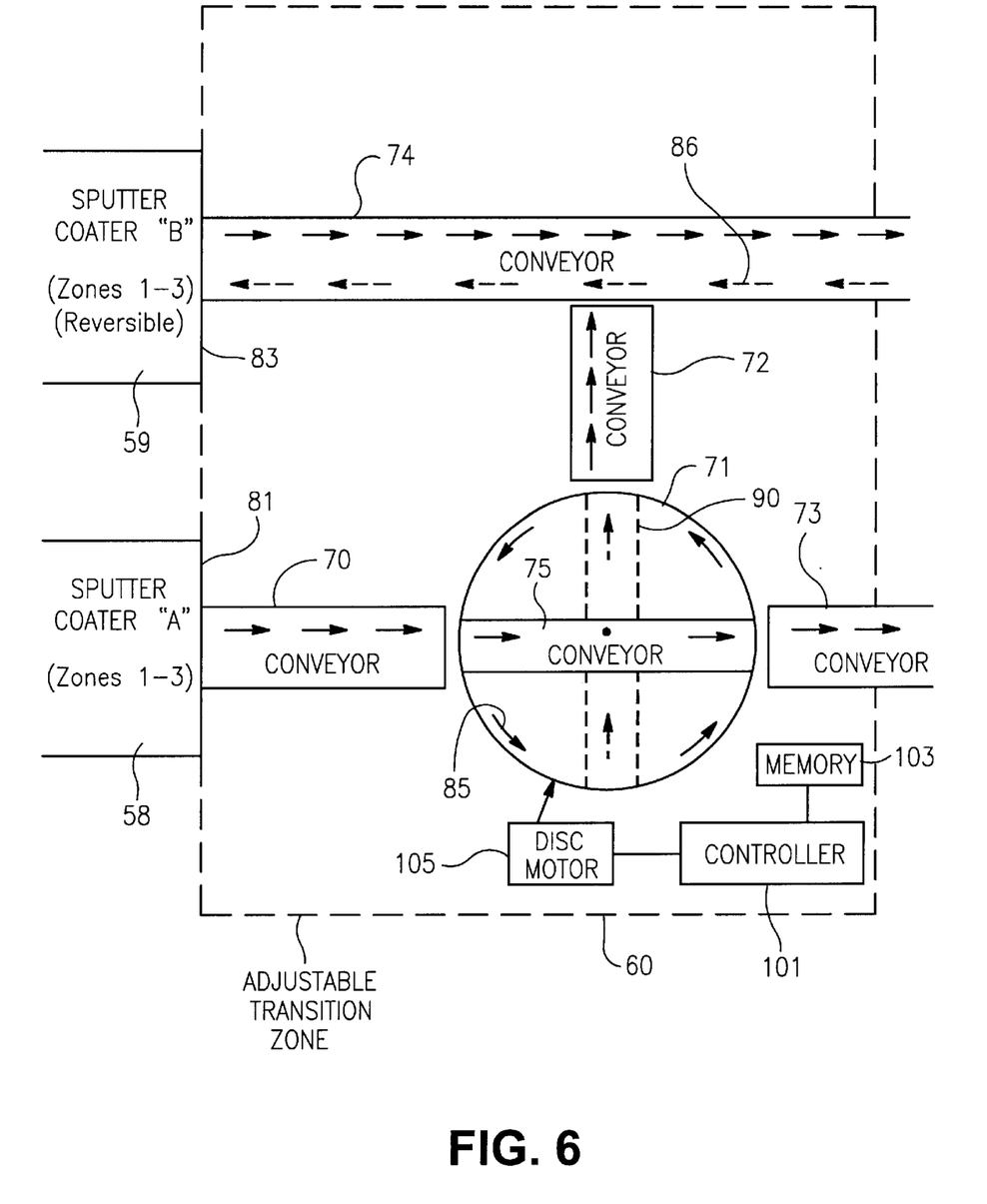
FIG. 6 is a schematic functional diagram of the adjustable transition zone of the FIG. 4 sputter coating apparatus.

FIG. 6 is a functional top view diagram of transition zone 60 which selectively couples respective ends of sputter coating lines 58 and 59 according to the FIGS. 4–5 embodiment of this invention. As can be seen, transition zone 60 includes conveyor 70 coupled to an output end of sputter coating line 58, rotatable conveyor platform 71 including conveyor 75 which may be selectively deployable in different positions, conveyor 72 provided between a potential output of conveyor 75 and conveyor 74, conveyor 73 provided between another potential output of conveyor 75 and an output of the overall sputter coating apparatus, and reversible conveyor 74 provided at an input/output of sputter coating line 59. End 83 of line 59 can function as an output end when lines 58 and 59 are operating in parallel with one another, and as an input end of line 59 when lines 58 and 59 are operating in series with one another. Platform 71 and conveyor 75 thereon are selectively deployable in different positions in order to selectively couple output end 81 of sputter coating line 58 to an input/output 83 end of sputter coating line 59 when desired.

When sputter coating lines 58 and 59 are not coupled together by transition zone 60, platform 71 and conveyor 75 are in the position illustrated in FIG. 6 by solid lines so that lines 58 and 59 are operating in parallel with one another. In this case, for example, FIG. 1 coated articles may be exiting sputter coating line 58 at output 81 and are being conveyed to the overall output of the apparatus by conveyor 70 which dumps articles onto conveyor 75 which dumps them onto conveyor 73. Likewise, FIG. 1 coated articles may simultaneously be exiting output 83 of sputter coating line 59, and being forwarded to the output of the overall apparatus by conveyor 74 as shown by the solid lines illustrated in conveyor 74.

When it is desired make a larger coating system (e.g., the layer system of FIG. 2) on a substrate having more layers than either of lines 58, 59 is capable of forming, then the direction of conveyor 74 may be reversed and platform 71 may be rotated 85 in order to selectively couple output 81 of sputter coating line 58 to an input end 83 of sputter coating line 59. See FIG. 6 in this regard. Rotation 85 moves conveyor 75 from the solid line position to the dotted line position shown in FIG. 6. Accordingly, an incomplete coated article exits coating line 58 at 81 onto conveyor 70 (e.g., when making the FIG. 2 layer system, the coated article at this point may include layers 2–5 and half of layer 6a on substrate 1). The incomplete article is dumped onto conveyor 75 by conveyor 70. Once on conveyor 75, platform 71 rotates 85 until conveyor 75 is in the position illustrated in dotted lines in FIG. 6. Conveyor 75 then dumps the incomplete article onto conveyor 72, which in turn dumps the incomplete coated article onto conveyor 74 which is traveling in direction 86 (i.e., its reverse direction). Conveyor 74 then conveys the incomplete coated article to input 83 of coating line 59 so that the additional layer(s) can be sputter coated thereon (e.g., the rest of layer 6a and layers 7–10 may be deposited on substrate 1 in line 59).

Once an incomplete coated article exiting line 58 has been forwarded to conveyor 72 by conveyor 75, platform 71 may rotate back to the solid line position shown in FIG. 6 in order to accept another complete or incomplete coated article from output 81 of coating line 59. Whether or not additional layer(s) are to be deposited on newly received article(s) determines whether or not platform 71 causes an article received there on to be forwarded to conveyor 72 or conveyor 73. Likewise, the direction of conveyor 74 is determined by whether or not end 83 of coating line 59 is functioning as an output or an input (end 83 functions as an input when receiving incomplete coated articles from conveyor 72 and platform 71).

Figure 7:
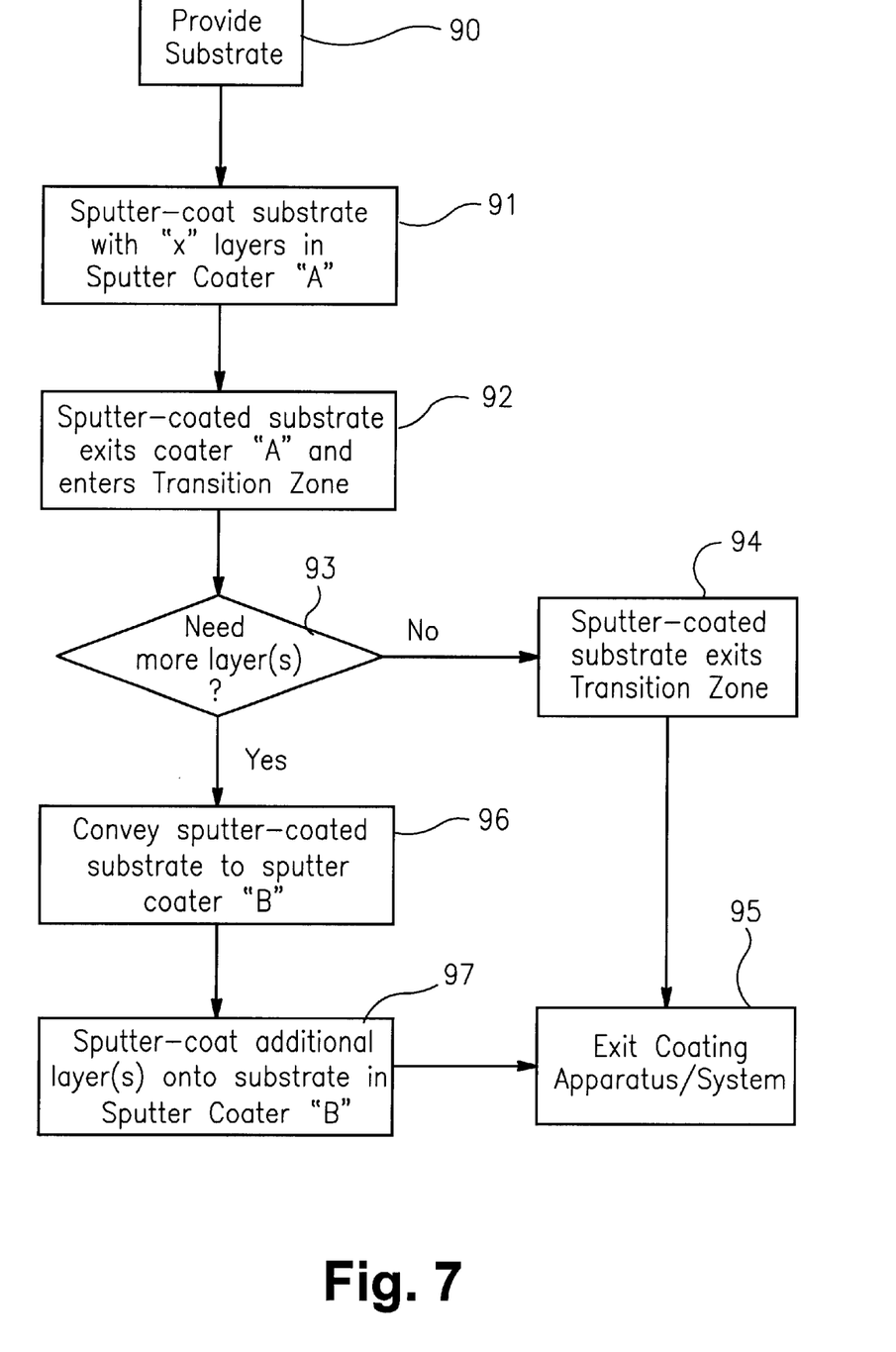
FIG. 7 is a flowchart illustrating certain steps taken during the course of carrying out a particular embodiment of this invention.

FIG. 7 is a flowchart illustrating certain steps carried out and in accordance with an embodiment of this invention. Referring to FIGS. 4–7, and especially FIG. 7, a substrate 1 (e.g., soda-lime-silica glass substrate) is first provided (step 90). Substrate 1 is then conveyed through a first sputter coating line 58 so that a plurality of layer(s) can be deposited thereon (step 91) (e.g., layers 2–6 of FIG. 1, or layers 2–6a of FIG. 2). The coated article including a plurality of sputter coated layers on substrate 1 then exits the first sputter coating line 58 and enters transition zone 60 (step 92). A determination is then made by controller 101 as to whether or not the desired layer system has been completed or whether additional layers need to be sputter-coated thereon (step 93). This determination by controller 101 may be based upon input from a keyboard, or any other suitable means such as a programmed listing of articles to be made by the system. If it is determined that the layering system has been completed and no additional layers need be sputtered thereon, then the sputter coated article exits the transition zone (step 94) and the overall sputter coating apparatus (step 95) when conveyor 75 is in the position shown in FIG. 6 by solid lines. However, when controller 101 (which may access and utilize programs stored in memory 103) determines in step 93 that the layering system is incomplete and requires additional layer(s), then controller 101 causes motor 105 to rotate platform/disk 71 so as to move conveyor 75 and the coated article thereon to the position 90 shown in dotted lines in FIG. 6. Then, the coated article is conveyed to end 83 of sputter coating line 59 via conveyor 72 and conveyor 74 (step 96). The coated article enters sputter coating line 59 so that additional layers (e.g., the remainder of layer 6a and layers 7–10) can be sputtered thereon (step 97). After passing through sputter coating line 59, the article exits the coating apparatus/system at 67 (step 95).

It is noted that transition zone 60 is preferably maintained in a given atmosphere (e.g., argon atmosphere) at a low pressure similar to the pressures in zones 1–3 (e.g., from about 1.0 to 3.0×10$^{-3}$ Torr) according to certain embodiments of this invention, so as to reduce the potential for contamination of coated articles when traveling between coating lines 58 and 59.

Figure 8:
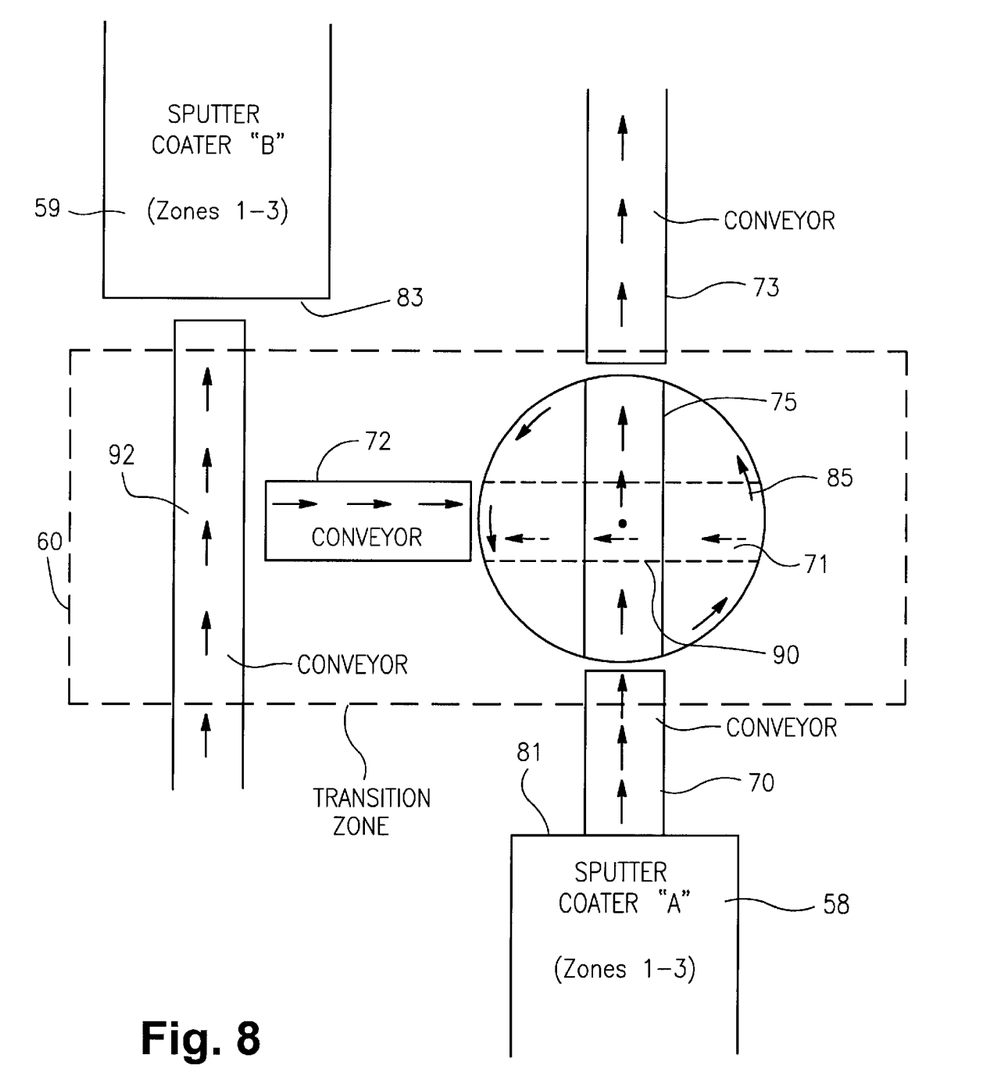
FIG. 8 is a schematic functional diagram of a transition zone for selectively coupling ends of first and second sputter coating lines according to another embodiment of this invention.

FIG. 8 is a functional schematic diagram of a transition zone for selectively coupling sputter coating line 58 and sputter coating line 59 according to another embodiment of this invention. This embodiment is similar to that of FIGS. 4–6, except that the two lines 58 and 59 are staggered relative to one another so that second line 59 need not have a reversible conveyor. In other words, in the FIG. 8 embodiment end 83 of second sputter coating line 59 is an input end of line 59 regardless of whether lines 58 and 59 are operating in parallel or in series.

An exemplary operation of the FIG. 8 embodiment is as follows. A substrate 1 is fed into and passes through first sputter coating line 58 including targets 21–35 (see FIG. 5) so that layer 2 is deposited in zone 1, layers 3–5 in zone 2, and layer 6 or half of layer 6a in zone 3. The article including these layers exits the first sputter coating line 58 via conveyor 70. The article is fed onto conveyor 75. It is determined (either at this time or in advance) whether additional layer(s) have to be deposited onto the article. If not, then platform 71 remains in the position shown in FIG. 8 and conveyor 75 forwards the article with complete layering system thereon to conveyor 73 which takes the coated article out of transition zone 60 and out of the overall sputter coating apparatus. However, if it is desired to provide additional layer(s) on the article, then platform 71 rotates as discussed above until conveyor 75 is in position 90 shown in dotted lines in FIG. 8. This enables conveyor 75 to forward the article to conveyor 92 which need not be reversible in all embodiments. Once on conveyor 92, the article enters second sputter coating line 59 including zones 1–3 and respective targets (e.g., see FIG. 5). In second line 59, the remainder of layer 6a is sputtered on in zone 1, layers 7–9 are sputtered on in zone 2, and layer 10 is sputtered on in zone 3 of line 59. Alternatively, lines 58 and 59 may operate in parallel with one another so that each can form the layering system of FIG. 1 on respective substrates 1 at the same time.

It is also noted that the coated articles of FIGS. 1 and 2 are provided for purposes of example only and are not intended to be limiting. The sputter coating apparatus of FIGS. 4–6 and 8, and method of FIG. 7, may be utilized to manufacture any type of sputter coated article according to different embodiments of this invention. Coating lines 58 and 59 may be operated in the same direction in parallel with one another as shown by paths 61 and 62 when the two lines are not coupled to one another. However, when it is desired to utilize both lines 58 and 59 to manufacture a single coated article, transition zone 60 functions to selectively couple an output end of a first line to an input end of a second line so that the lines 58 and 59 run in series with one another. The second line may be reversible in nature so that its input end may also function as an output end when it is operating in series with the first line (e.g., path 62). Moreover, the instant invention need not be limited to sputter coating apparatuses, and may be used in conjunction with other types of layer deposition systems.

Figure 9:
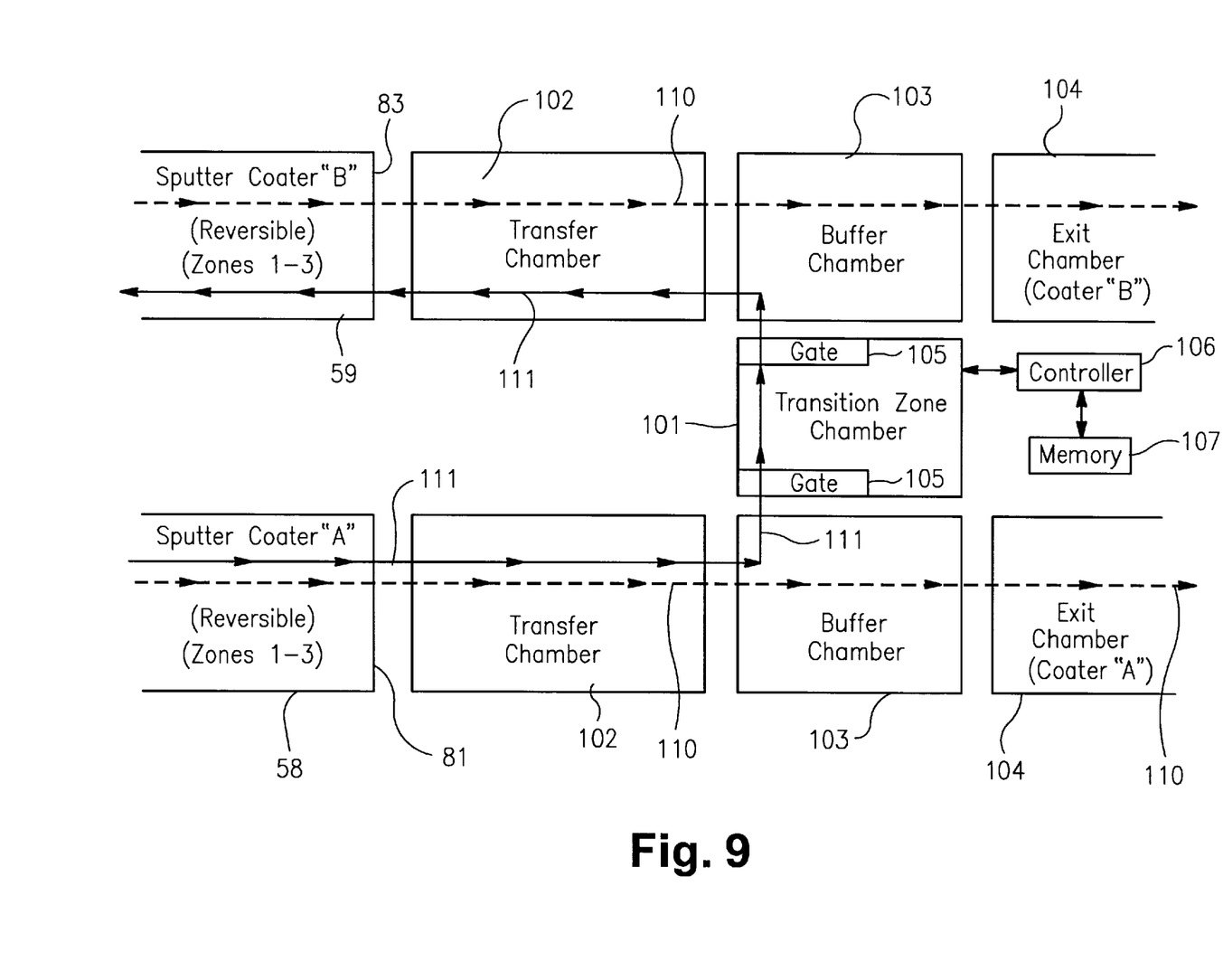
FIG. 9 is a schematic functional diagram of an apparatus according to another embodiment of this invention.

FIG. 9 is a functional top view diagram of transition zone or chamber 101 which selectively couples respective ends or portions of sputter coating lines 58 and 59 according to the FIGS. 4–5 embodiment of this invention. As illustrated, each coating line includes a transfer chamber 102, a buffer chamber 103, and an exit chamber 104. Transfer zone or chamber 101 in this embodiment is located between the buffer chambers 103 of the two sputter coating lines. As illustrated, transfer in chamber/zone 101 is performed by enabling coated glass to be moved in the chamber/zone 101 in a direction perpendicular to the line directions of lines 58, 59. Accordingly, buffer chambers 103 also are capable of causing coated glass to be transferred in both the (a) line directions of lines 58, 59 (i.e., the same direction the glass is transported during sputter coating in the line), and (b) directions transverse to the line directions of lines 58, 59. Chambers 101 and 103 may be approximately the same size as one another.

Transition zone/chamber 101 preferably has a gate and/or valve 105 at each end thereof, such gates/valves being selectively openable/closeable in order to allow coated glass to enter/leave the chamber 101 and thus be transferred from one coating line to the other coating line.

Transition zone/chamber 101 may include a conveyor (e.g., reversible conveyor) coupled to the buffer chamber 103 of coating line 58 and the buffer chamber 103 of line 59 so as to enable coated glass to be transferred from one coating line to the other. Controller 106, using program(s) stored in memory 107, selectively controls gates 105 and a conveyor of the chamber 101 so as to enable such transfers when desired.

Exit chambers 104 can function as output ends of the coating lines when lines 58 and 59 are operating in parallel with one another (i.e., where substrates proceed through the coating lines along paths 110 shown in dotted lines). Thus, when sputter coating lines 58 and 59 are not coupled together by transition zone 101, the coating lines 58 and 59 are operating in parallel with one another so that substrates proceeding therethrough move along paths 110 (dotted lines) and FIG. 1 coated articles may be formed and caused to exit sputter coating lines 58 and 59 at exit chambers 104.

Still referring to FIG. 9, when it is desired make a larger coating system (e.g., the layer system of FIG. 2) on a substrate having more layers than either of lines 58, 59 is capable of forming, then transition zone/chamber 101 may be used (including opening of gates/valves 105) to selectively couple the buffer chambers 103 of the respective lines 58, 59 thereby coupling sputter coating line 58 to sputter coating line 59. Path 111 is now used in the FIG. 9 embodiment. Accordingly, an incomplete coated article exits coating line 58 at 81 and moves into the buffer chamber 103 of line 58. From this buffer, the incomplete article is caused to change directions (see path 111 in FIG. 9) and proceed into transition zone 101 (e.g., via a conveyor) and then out of zone 101 and into buffer 103 of the other sputter coating line 59 (e.g., when making the FIG. 2 layer system, the coated article at this point may include layers 2–5 and half of layer 6a on substrate 1). The incomplete article is then dumped on line 59 (which is in reverse) and enters the line at 83 so that the additional layer(s) can be sputter coated thereon (e.g., the rest of layer 6a and layers 7–10 may be deposited on substrate 1 in line 59). Then, what had been an input end of line 59 becomes an output end of line 59 when FIG. 2 coated articles are made in accordance with the FIG. 9 embodiment of this invention.

Still referring to FIG. 9, FIG. 1 coated articles may be produced using one or both lines 58, 59 for several days at a time (or alternatively, for only several hours at a time). Then, gates 105 may be opened (manually, or automatically via controller) so that FIG. 2 coated articles can be produced using lines 58–59 as described above. Thus, there is no need to make a determination in the controller after each glass sheet runs through whether the next sheet will go to the other line or not (however, this may in fact be done in certain embodiments).

Once given the above disclosure, many other features, modifications, and improvements will become apparent to the skilled artisan. Such other features, modifications, and improvements are therefore considered to be a part of this invention, the scope of which is to be determined by the following claims.

What is claimed is:

1. A sputter coating apparatus comprising:

a first sputter coating line including a plurality of zones and a plurality of targets;

a second sputter coating line including a plurality of zones and a plurality of targets; and a transition chamber or zone including first and second gates or valves which may be selectively opened, said transition chamber being selectively coupleable to the first sputter coating line and the second sputter coating line, said transition chamber selectively coupling the first and second sputter coating lines to one another so that when not coupled to one another the first and second lines can run in parallel with one another and when coupled to one another by the transition chamber the first and second lines run in series with one another.

2. The sputter coating apparatus of claim 1, wherein said transition chamber is maintained at a pressure less than atmospheric pressure.

3. The sputter coating apparatus of claim 2, wherein said transition chamber is maintained at a pressure of from about 1.0 to $3.0 \times 10^{-3}$ Torr.

4. The sputter coating apparatus of claim 1, wherein said second sputter coating line is reversible so that a first end of said second sputter coating line is an output end of said second sputter coating line when the first and second sputter coating lines are running in parallel to one another and said first end of said second sputter coating line is an input end of said second sputter coating line when said first and second sputter coating lines are running in series with one another.

5. The sputter coating apparatus of claim 1, wherein said transition chamber comprises a conveyor that selectively moves between first and second positions depending upon whether said first and second sputter coating lines are running in parallel or in series with one another.

6. A method of operating a sputter coating apparatus, the method comprising:

providing first and second sputter coating lines selectively coupleable to one another;

causing a substrate to pass through the first sputter coating line so that at least first and second layers are sputtered onto the substrate in the first sputter coating line;

determining whether an additional layer or additional layers are to be sputtered onto the substrate;

based upon a result of said determining step, determining whether to forward the substrate to the second sputter coating line or to an exit area.

\* \* \* \* \*